(12) United States Patent
Shin et al.

(10) Patent No.: US 9,928,917 B2
(45) Date of Patent: Mar. 27, 2018

(54) MEMORY DEVICE AND MEMORY SYSTEM HAVING THE SAME

(71) Applicant: Samsung Electronics Co., Ltd., Suwon-si, Gyeonggi-do (KR)

(72) Inventors: Hyun-Jin Shin, Hwaseong-si (KR); Ho Young Shin, Gunpo-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/440,625

(22) Filed: Feb. 23, 2017

(65) Prior Publication Data

US 2018/0012662 A1 Jan. 11, 2018

(30) Foreign Application Priority Data

Jul. 6, 2016 (KR) ........................ 10-2016-0085391

(51) Int. Cl.
| | | |
|---|---|---|
| *G11C 7/00* | (2006.01) | |
| *G11C 16/24* | (2006.01) | |
| *G11C 16/04* | (2006.01) | |
| *G11C 16/30* | (2006.01) | |
| G11C 11/4074 | (2006.01) | |
| G11C 11/417 | (2006.01) | |

(52) U.S. Cl.
CPC .......... *G11C 16/24* (2013.01); *G11C 16/0466* (2013.01); *G11C 16/30* (2013.01); *G11C 11/4074* (2013.01); *G11C 11/417* (2013.01)

(58) Field of Classification Search
CPC ... G11C 7/04; G11C 11/406; G11C 11/40626; G11C 5/147; G11C 5/143

USPC ................................................ 365/211, 203
See application file for complete search history.

(56) References Cited

U.S. PATENT DOCUMENTS

| | | | |
|---|---|---|---|
| 7,269,092 B1* | 9/2007 | Miwa | G11C 5/147 |
| | | | 365/189.09 |
| 7,679,133 B2 | 3/2010 | Son et al. | |
| 7,755,948 B2 | 7/2010 | Dudeck et al. | |
| 7,848,171 B2 | 12/2010 | Miyako | |
| 7,948,820 B2 | 5/2011 | Yang et al. | |
| 8,040,725 B2 | 10/2011 | Kang | |
| 8,300,484 B2 | 10/2012 | Yoshida | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 9,191,022 B2 | 11/2015 | McLaury | |
| 2008/0144415 A1* | 6/2008 | Macerola | G01K 7/01 |
| | | | 365/211 |
| 2011/0233648 A1 | 9/2011 | Seol et al. | |
| 2015/0332780 A1 | 11/2015 | Jang et al. | |
| 2016/0064091 A1 | 3/2016 | Shin | |

FOREIGN PATENT DOCUMENTS

KR 20160025390 A 3/2016

* cited by examiner

*Primary Examiner* — Son Dinh
(74) *Attorney, Agent, or Firm* — Harness, Dickey & Pierce, P.L.C.

(57) ABSTRACT

A memory device includes a memory cell, a bit line connected to the memory cell, a control voltage generator configured to generate a proportional to absolute temperature (PTAT) current and generate an analog control voltage inversely proportional to the PTAT current, and a load current control circuit configured to control a first load current supplied to the bit line based on the analog control voltage.

20 Claims, 11 Drawing Sheets

MEMORY DEVICE AND MEMORY SYSTEM HAVING THE SAME

CROSS-REFERENCE TO RELATED APPLICATION

This application claims priority under 35 U.S.C. § 119(a) from Korean Patent Application No. 10-2016-0085391 filed on Jul. 6, 2016, the disclosure of which is hereby incorporated by reference in its entirety.

BACKGROUND

Example embodiments of the present inventive concepts relate to a memory device and/or a memory system having the memory device. For example, at least some example embodiments relate to a memory device which can adaptively compensate for a bit line leakage current depending on temperature using a proportional to absolute temperature (PTAT) current, and/or a memory system having the same.

A NAND flash memory cell may be divided into an on-cell and an off-cell depending on a program. When the memory cell is an on-cell, currents flowing in a bit line are referred to as on-cell currents, and when the memory cell is an off-cell, currents flowing in the bit line are referred to as off-cell currents.

As a process is refined, an operation voltage may be lowered, and thereby the on-cell currents may be reduced, and leakage currents of a bit line may increase at a high temperature (for example, 85° C. to 150° C.). When the off-cell is read, the off-cell may be sensed as the on-cell by mistake due to the leakage currents flowing through the bit line, thereby reducing a sense margin of the on-cell and the off-cell.

A current generator for generating load currents to compensate for the leakage currents of the bit line may be disposed on an integrated circuit including a NAND flash memory cell. However, the leakage currents of the bit line are proportional to temperature, but the load currents generated by the current generator are inversely proportional to the temperature. Accordingly, the load currents are unnecessarily generated at a low temperature (for example, −25° C. to −40° C.)

SUMMARY

An example embodiment of the present inventive concepts is directed to a memory device including a memory cell; a bit line connected to the memory cell; a control voltage generator configured to generate a proportional to absolute temperature (PTAT) current based on a control code, and to generate an analog control voltage inversely proportional to the PTAT current; and a load current control circuit configured to control a first load current supplied to the bit line based on the analog control voltage.

An example embodiment of the present inventive concepts is directed to a memory system including a memory controller; and a memory device connected to the memory controller, the memory device including, a memory cell, a bit line connected to the memory cell, a control voltage generator configured to generate a proportional to absolute temperature (PTAT) current based on a control code, and to generate an analog control voltage inversely proportional to the PTAT current, and a load current control circuit configured to control a first load current supplied to the bit line based on the analog control voltage.

An example embodiment of the present inventive concepts is directed to a memory device including a control voltage generator configured to generate an analog control voltage that is inversely proportional to a proportional to absolute temperature (PTAB) current; and a load current control circuit configured generate a first load current based on the analog control voltage, the first load current being supplied to a memory cell via a bit line.

BRIEF DESCRIPTION OF THE DRAWINGS

These and/or other aspects and advantages of the present general inventive concepts will become apparent and more readily appreciated from the following description of the example embodiments, taken in conjunction with the accompanying drawings of which.

DETAILED DESCRIPTION

Figure 1:
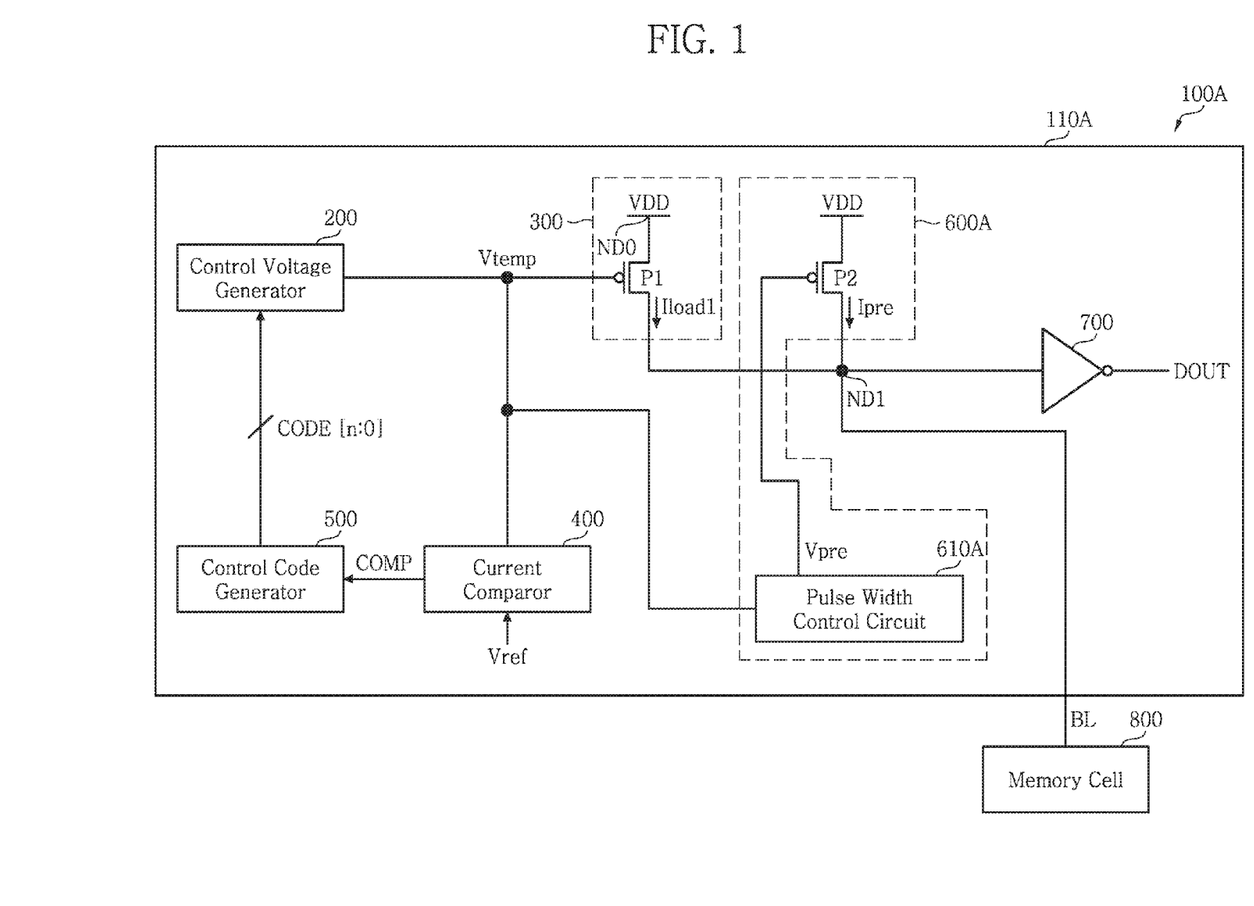
FIG. 1 is a block diagram of a memory device according to example embodiments of the present inventive concepts.

FIG. 1 is a block diagram of a memory device according to example embodiments of the present inventive concepts.

Referring to FIG. 1, a memory device 100A includes a sensing circuit 110A, a memory cell 800, and a bit line BL connected between the sensing circuit 110A and the memory cell 800. The memory device 100A may be a semiconductor chip or a semiconductor package.

According to example embodiments, the memory cell 800 may be embodied in a dynamic random access memory (DRAM), a static RAM (SRAM), or a NAND flash memory.

During a read operation of the memory device 100A, the sensing circuit 110A pre-charges a bit line BL, develops the bit line BL according to whether the memory cell 800 is an on-cell or an off-cell after the bit line BL is pre-charged, senses changes in a voltage of the bit line BL after the bit line BL is developed, and outputs data Dout based on a result of the sensing. The development procedure may not be performed according to an example embodiment.

The sensing circuit 110A may include a control voltage generator 200, a load current control circuit 300, a current comparator (or, alternatively, a current generator) 400, a control code generator 500, a pre-charge circuit 600A, and an inverter 700.

The control voltage generator 200 may generate a proportional to an absolute temperature (PTAT) current and generate an analog control voltage Vtemp which is inversely proportional to the PTAT current.

The load current control circuit 300 may control a first load current Iload1 supplied to the bit line BL in response to the analog control voltage Vtemp.

The load current control circuit 300 may be embodied in a first PMOS transistor P1. The first PMOS transistor P1 is connected between a power node ND0 for supplying an operation voltage VDD and a first node ND1, and includes a gate for receiving the analog control voltage Vtemp.

When a temperature (or an absolute temperature) of the memory device 100A increases, an amount of the first load current Iload1 may increase. The load current control circuit 300 may generate the first load current Iload1 which is proportional to the temperature, and supply the generated first load current Iload1 to the bit line BL, and thus the memory device 100A may adaptively compensate for a bit line leakage current depending on the temperature.

Figure 5:
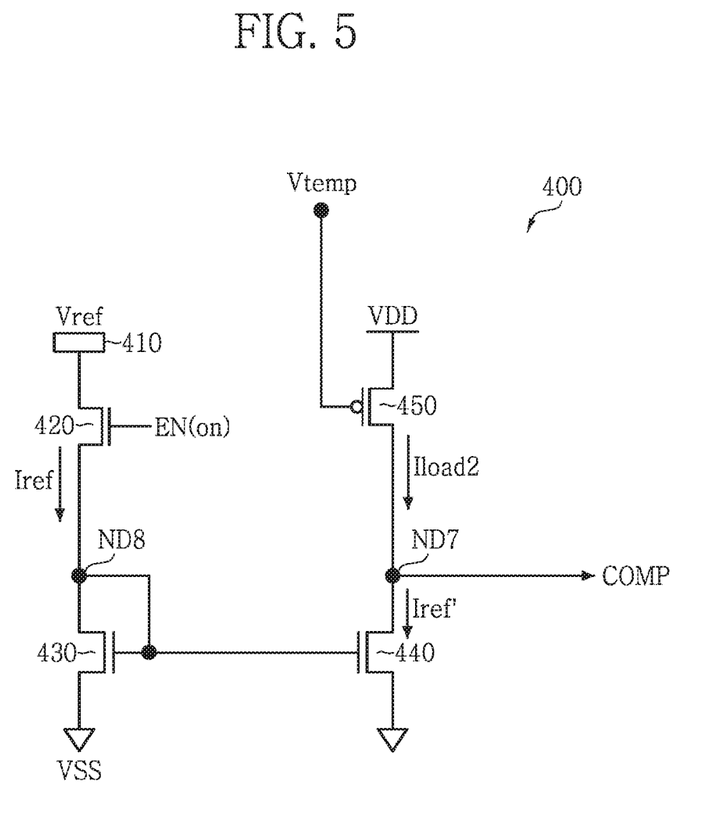
FIG. 5 is a specific circuit diagram of a current comparator shown in FIG. 1.

The current comparator 400 to be described referring to FIG. 5 generates a second load current Iload2 based on the analog control voltage Vtemp, compares the second load current Iload2 with a reference current Iref, and generates a comparison signal COMP. The amount of the first load current Iload1 may be the same as an amount of the second load current Iload2.

The control code generator 500 may generate a control code CODE[n:0] based on a comparison signal COMP and output the generated control code CODE[n:0] to the control voltage generator 200. The control voltage generator 200 may control the PTAT current based on the control code CODE[n:0]. Here, n may be a natural number.

FIG. 5 is a specific circuit diagram of a current comparator shown in FIG. 1.

Referring to FIGS. 1 and 5, when the amount of the second load current Iload2 is less than the amount of the reference current Iref, the control code generator 500 may generate a control code CODE[n:0] having a first value, and the control voltage generator 200 may increase the amount of the PTAT current based on the control code CODE[n:0] having the first value.

The current comparator 400 and the control code generator 500 are capable of controlling the PTAT current so that the amount of the first load current Iload1 supplied to the bit line BL is the same as the amount of the reference current Iref, and thus the memory device 100A may improve characteristics of the first load current Iload1 in accordance with changes in process by performing trimming on the first load current Iload1.

Referring back to FIG. 1, the pre-charge circuit 600A may pre-charge the bit line BL with a pre-charge voltage during a read operation of the memory device 100A. The pre-charge circuit 600A may include a pulse width control circuit 610A and a pre-charge current control circuit P2.

The pulse width control circuit 610A may control a pulse width of a pre-charge control signal Vpre based on the analog control voltage Vtemp. When the temperature of the memory device 100A goes up, the pulse width of the pre-charge control signal Vpre increases, and when the temperature of the memory device 100A goes down, the pulse width of the pre-charge control signal Vpre decreases.

The pre-charge current control circuit P2 may be embodied in a second PMOS transistor P2. The second PMOS transistor P2 is connected between the power node ND0 and the first node ND1 and includes a gate for receiving the pre-charge control signal Vpre.

The pre-charge current control circuit P2 may control the value of pre-charge currents Ipre supplied to the bit line BL based on a pulse width of the pre-charge control signal Vpre. When the temperature of the memory device 100A goes up, the amount of the pre-charge currents Ipre may increase. A current driving capability of the pre-charge current control circuit P2 may be larger than a current driving capability of the load current control circuit 300.

The pre-charge circuit 600A adjusts the pulse width of the pre-charge control signal Vpre to be proportional to temperature, and control the amount of the pre-charge currents Ipre supplied to the bit line BL based on the adjusted pulse width, and thus the memory device 100A may adaptively compensate for a bit line leakage current depending on the temperature.

The inverter 700 may inverse a voltage of the bit line BL and output data Dout.

Figure 2:
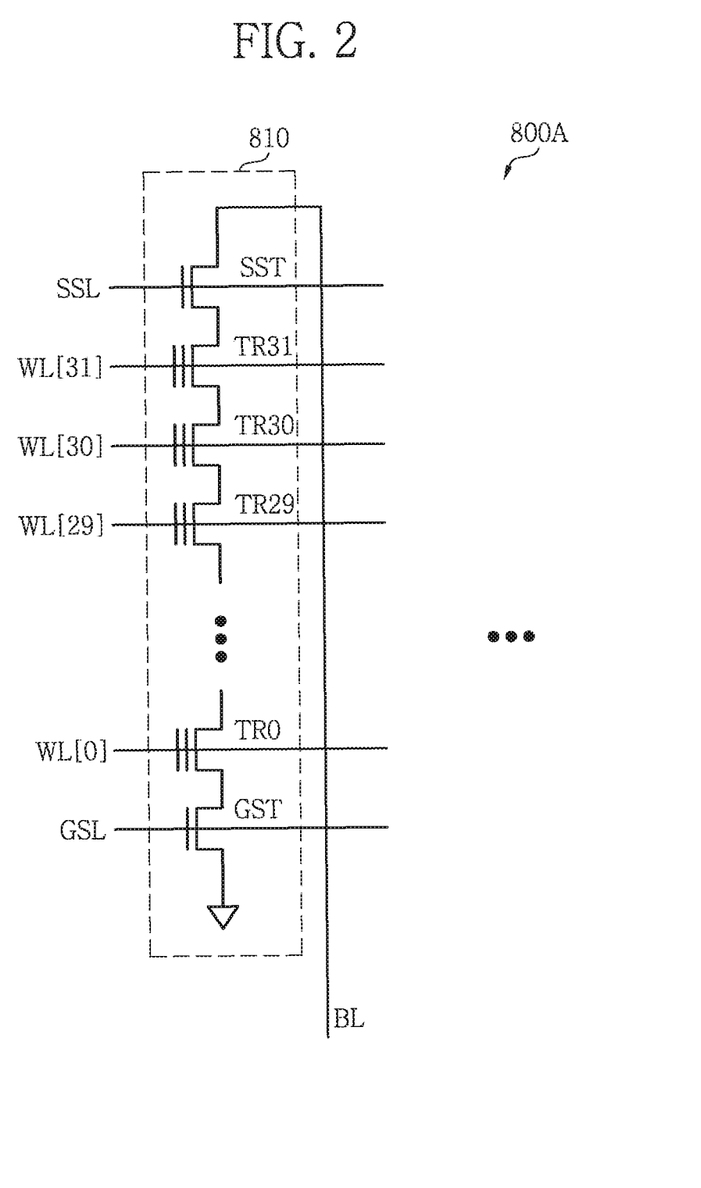
FIG. 2 is a schematic circuit diagram of a memory cell shown in FIG. 1.

FIG. 2 is a schematic circuit diagram of a memory cell shown in FIG. 1.

Referring to FIG. 2, a memory cell 800A may be embodied in a cell string (or NAND string) 810 including a plurality of non-volatile memory cells. According to example embodiments, the memory cell 800A may include a plurality of cell strings, each of the plurality of cell strings may be disposed (or embodied) in the two-dimensionally same plane (or layer), and/or may be disposed in three-dimensionally different planes.

The cell string 810 shown in FIG. 2 includes a first selection transistor SST connected to the bit line BL, a second selection transistor GST connected to a ground, and a plurality of non-volatile memory cells TR0 to TR31 connected in series between the first selection transistor SST and the second selection transistor GST.

A selection signal (for example, a read voltage during a read operation) is supplied to a string selection line SSL connected to a gate of the first selection transistor SST. As a result, the first selection transistor SST may be turned on or off.

A selection signal (for example, a read voltage during a read operation) is supplied to a ground selection line GSL connected to a gate of the second selection transistor GST. As a result, the second selection transistor GST may be turned on or off.

Each of the plurality of non-volatile memory cells TR0 to TR31 may be embodied in a NAND flash memory cell, e.g., a single level cell (SLC) or a multi-level cell (MLC), which can store one or more bits. A gate of each of the plurality of NAND flash memory cells TR0 to TR31 is connected to each of a plurality of word lines WL[0] to WL[31].

For convenience of description, 32 word lines WL[0] to WL[31] are shown in FIG. 2; however, the number of word lines is not limited thereto in example embodiments of the present inventive concepts.

Figure 3:
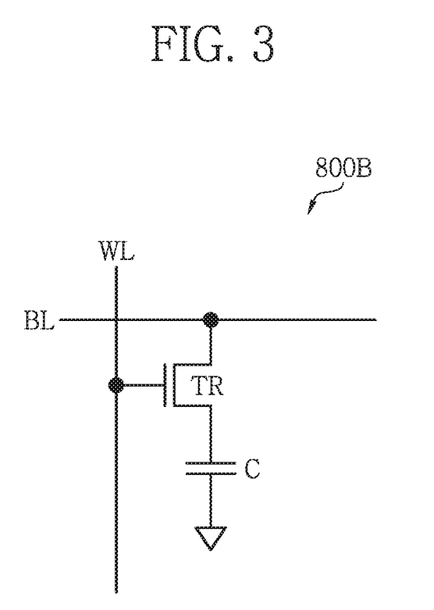
FIG. 3 is a schematic circuit diagram of the memory cell shown in FIG. 1.

FIG. 3 is a schematic circuit diagram of the memory cell shown in FIG. 1.

Referring to FIG. 3, a memory cell 800B may be embodied in a DRAM referring to FIG. 3. The memory cell 800B includes one transistor TR and one capacitor C. A gate of the transistor TR is connected to a word line WL.

Figure 4:
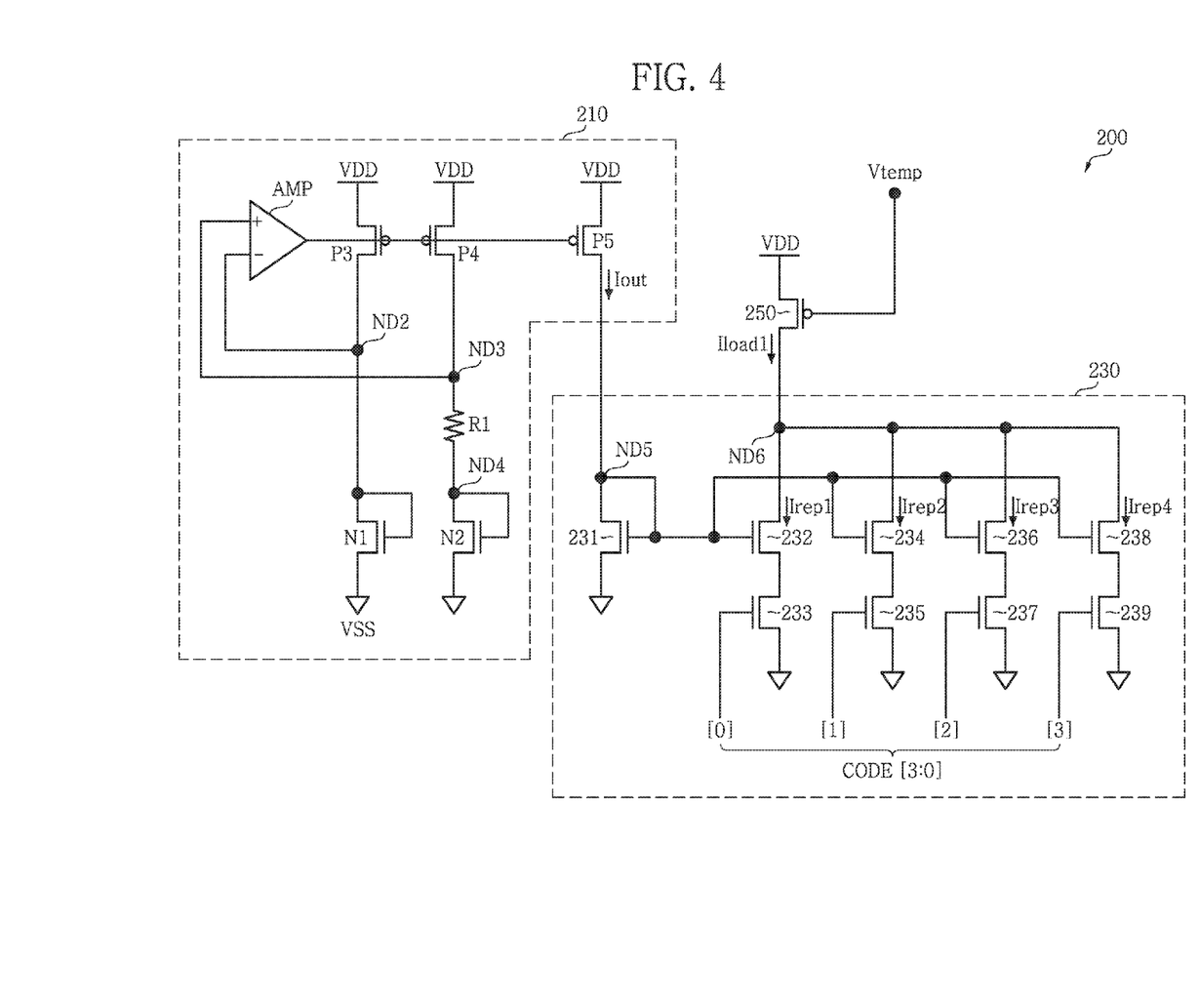
FIG. 4 is a specific circuit diagram of a control voltage generator shown in FIG. 1.

FIG. 4 is a specific circuit diagram of a control voltage generator shown in FIG. 1.

Referring to FIG. 4, the control voltage generator 200 may include a PTAT current source 210, a current mirror 230, and a current-voltage converter 250.

The PTAT current source 210 may generate an output current Iout which is proportional to temperature. The PTAT current source 210 may include a third PMOS transistor P3, a fourth PMOS transistor P4, a fifth PMOS transistor P5, a diode-connected first NMOS transistor N1, a diode-connected second NMOS transistor N2, a first resistor R1, and an amplifier AMP.

The third PMOS transistor P3 is connected between the power node ND0 and a second node ND2, the fourth PMOS transistor P4 is connected between the power node ND0 and a third node ND3, and the fifth PMOS transistor P5 is connected between the power node ND0 and a fifth node ND5.

The diode-connected first NMOS transistor N1 is connected between the second node ND2 and the ground, the diode-connected second NMOS transistor N2 is connected between the fourth node ND4 and the ground, and the first resistor R1 is connected between the third node ND3 and the fourth node ND4.

A voltage of the second node ND2 is fed back to a first input terminal (for example, a negative terminal) of the amplifier AMP, and a voltage of the third node ND3 is fed back to a second input terminal (for example, a positive terminal) of the amplifier AMP. A voltage difference between the second node ND2 and the third node ND3 occurs due to the first resistor R1, and the amplifier AMP amplifies the voltage difference between the second node ND2 and the third node ND3 and outputs the amplified voltage to gates of each of the PMOS transistors P3, P4, and P5. Each of the PMOS transistors P3, P4, and P5 is turned on or off based on the amplified voltage.

Channel width W/Channel length L values of each of the NMOS transistors N1 and N2 (hereinafter, referred to as a W/L ratio) are the same as or different from each other.

The output current Iout generated by the PTAT current source 210 may be calculated based on Equation 1.

$$Iout = VT * \left(\frac{\ln(n)}{R1}\right) = \frac{k*T}{q} * \left(\frac{\ln(n)}{R1}\right) \quad \text{[Equation 1]}$$

Here, VT refers to a thermal voltage, k refers to Boltzmann's constant, q refers to a charge amount of electron, T refers to an absolute temperature, and n refers to the number of NMOS transistors N2 having the same W/L ratio. As expressed in Equation 1, the PTAT current source 210 may generate an output current Iout proportional to the absolute temperature T.

The current mirror 230 includes an NMOS transistor 231 diode-connected to a first leg or a reference branch, and mirror branches included in a second leg. Each mirror branch may include each of NMOS transistors 232, 234, 236, and 238 and each of switches 233, 235, 237, and 239.

Each of the switches 233, 235, 237, and 239 is turned on/off in response to each bit included in control codes CODE[n:0] to CODE[3:0], and each of the NMOS transistors 232, 234, 236, and 238 is controlled according to ON/OFF of each of the switches 233, 235, 237, and 239.

When the output current Iout flows in the first leg, each of the NMOS transistors 232, 234, 236, and 238 in each mirror branch of the second leg operates as a current source according to a control (for example, ON or OFF) of each of the switches 233, 235, 237, and 239 and supplies each of reproduced currents Irep1 to Irep4 to the each mirror branch.

A ratio of the output current Iout to a reproduced first current Irep1 is determined according to a W/L ratio of a NMOS transistor 231 and a W/L ratio of a NMOS transistor 232. Similarly, a ratio of the output current Iout to a reproduced fourth current Irep4 is determined according to the W/L ratio of the NOS transistor 231 and the W/L ratio of a NMOS transistor 238. A ratio of the output current Iout to each of reproduced currents Irep2 and Irep3 is similarly determined as described above.

For example, it is assumed that the W/L ratio of the NMOS transistor 231 is 3, the W/L ratio of the NMOS transistor 232 is 1, a W/L ratio of an NMOS transistor 234 is 1.5, a W/L ratio of an NMOS transistor 236 is 2, and the W/L ratio of the NMOS transistor 238 is 2.5.

When the output current Iout flowing in the first leg is 3 µA and the control code CODE[0] to CODE[3] is '1010', a switch 233 is turned on, and the NMOS transistor 232 operates as a current source and supplies a reproduced current Irep1 corresponding to 3 µA*⅓=1 µA to a corresponding mirror branch. A switch 237 is turned on, and the NMOS transistor 236 operates as a current source and supplies a reproduced current Irep3 corresponding to 3 µA*⅔=2 µA to a corresponding mirror branch. The first load current Iload1 flowing in the second leg corresponds to a sum (1 µA+2 µA=3 µA) of reproduced currents Irep1 and Irep3 supplied from each mirror branch.

When the output current Iout flowing in the first leg is 4 µA and the control code CODE[0] to CODE[3] is '0010', the switch 237 is turned on, and the NMOS transistor 236 operates as a current source and supplies a reproduced current Irep3 corresponding to 4 µA*⅔=2.67 µA to a corresponding mirror branch. Therefore, the first load current Iload1 flowing in the second leg corresponds to 2.67 µA which is the reproduced current Irep3 supplied from a mirror branch.

For convenience of description, four mirror branches are shown in FIG. 4; however, the number of mirror branches is not limited thereto in the example embodiments of the present inventive concepts.

The current-voltage converter 250 may be embodied in a PMOS transistor 250 connected between the power node ND0 and a sixth node ND6. The PMOS transistor 250 senses the first load current Iload1 flowing in the sixth node ND6, and a gate voltage Vtemp of the PMOS transistor 250 is the analog control voltage determined according to the first load current Iload1. That is, the current-voltage converter 250 converts the first load current Iload1 into the analog control voltage Vtemp.

FIG. 5 is a specific circuit diagram of a current comparator shown in FIG. 1.

Referring to FIGS. 1 and 5, the current comparator 400 may include a pad (or pin) 410, a switch 420, a diode-connected NMOS transistor 430, an NMOS transistor 440, and a PMOS transistor 450. The pad 410 supplies the reference voltage Vref supplied from the outside of the memory device 100A to the switch 420. The switch 420 is turned on or off in response to an enable signal EN, and outputs the reference current Iref corresponding to the reference voltage Vref to an eighth node ND8 when the enable signal EN is ON.

The diode-connected NMOS transistor 430 is connected between the eighth node ND8 and the ground, the NMOS transistor 440 is connected between a seventh node ND7 and the ground, and a gate of the diode-connected NMOS transistor 430 and a gate of the NMOS transistor 440 are commonly connected to each other.

When the reference current Iref flows in the diode-connected NMOS transistor 430, the NMOS transistor 440 operates as a current source and outputs a reproduced reference current Iref'. The amount of the reference current Iref and an amount of the reproduced reference current Iref' may be the same as each other.

The PMOS transistor 450 is connected between the power node VDD and the seventh node ND7 and includes a gate for receiving the analog control voltage Vtemp. The PMOS transistor 450 may generate the second load current Iload2 based on the analog control voltage Vtemp. The amount of the first load current Iload1 and the amount of the second load current Iload 2 may be the same as each other.

The current comparator 400 may compare the reproduced reference current Iref' with the second load current Iload2 and output the comparison signal COMP to the control code generator 500. The control code generator 500 generates a control code CODE[n:0] based on the comparison signal COMP and outputs the generated control code CODE[n:0] to the control voltage generator 200.

The control voltage generator 200 may receive the control code CODE[n:0] and generate the PTAT current based on the received control code CODE[n:0].

For example, when the amount of the second load current Iload2 is more than an amount of the reproduced reference current Iref', a voltage of the seventh node ND7 increases, and thus the comparison signal COMP has a high level. When the comparison signal COMP is at the high level, the control code generator 500 generates a control code CODE[n:0] having a second value, and thus the control voltage generator 200 may decrease an amount of the PTAT current based on the control code CODE[n:0] having the second value.

On the other hand, when the amount of the second load current Iload2 is less than the amount of the reproduced reference current Iref', the voltage of the seventh node ND7 decreases to a ground level, and thus the comparison signal COMP has a low level. When the comparison signal COMP is at the low level, code generator 500 generates a control code CODE[n:0] having a first value and the control voltage generator 200 may increase the amount of the PTAT currents based on the control code CODE[n:0] having the first value.

Figure 6:
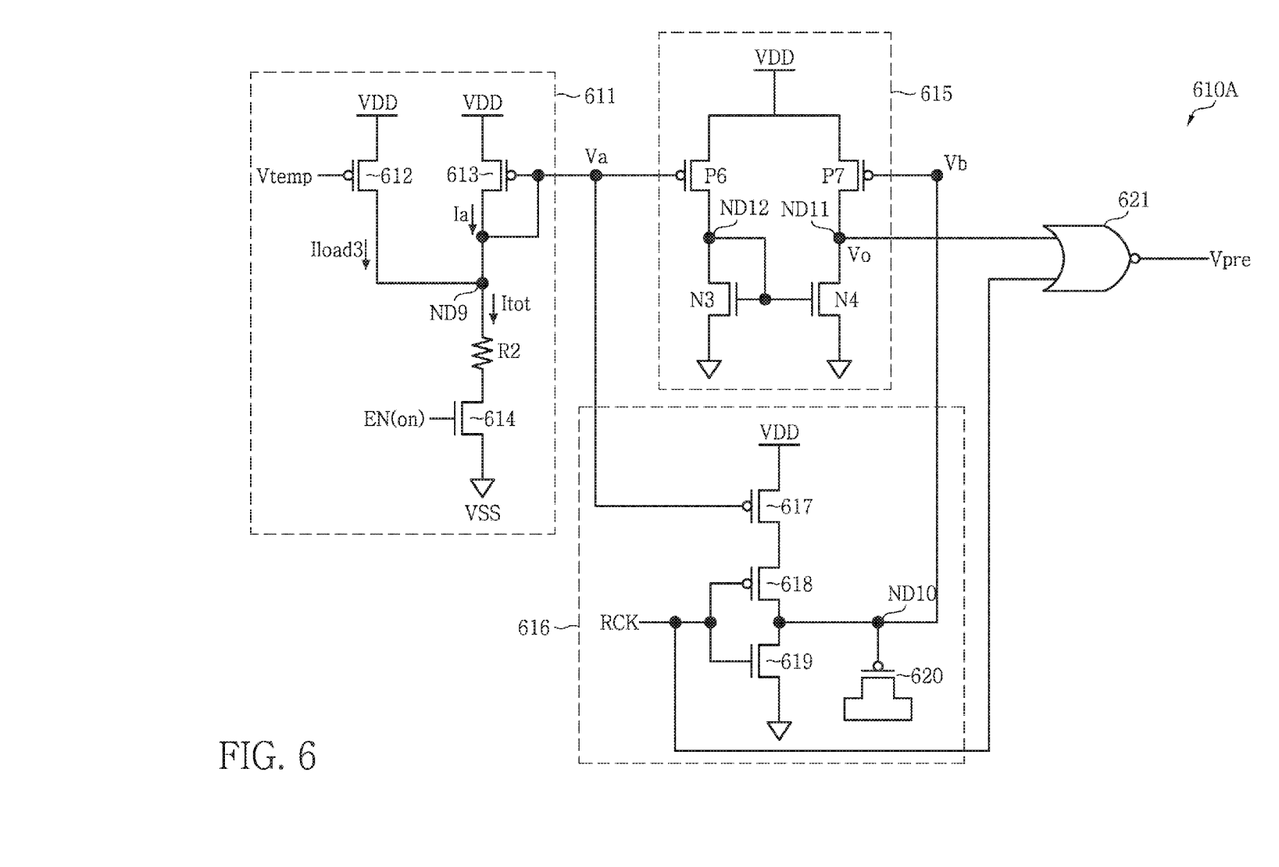
FIG. 6 is a specific circuit diagram of a pulse width control circuit shown in FIG. 1.

FIG. 6 is a specific circuit diagram of the pulse width control circuit shown in FIG. 1.

Referring to FIGS. 1 and 6, the pulse width control circuit 610A may include a first input voltage generator 611, a second input voltage generator 616, a differential amplifier 615, and a NOR gate 621.

The first input voltage generator 611 generates a first input voltage Va based on the analog control voltage Vtemp. The first input voltage generator 611 may include PMOS transistors 612 and 613, a second resistor R2, and an NMOS transistor 614.

The PMOS transistor 612 is connected between the power node ND0 and a ninth node ND9 and includes a gate for receiving the analog control voltage Vtemp. The PMOS transistor 612 outputs a third load current Iload3 to the ninth node ND9 in response to the analog control voltage Vtemp. The amount of the first load current Iload1 may be the same as an amount of the third load current Iload3.

The PMOS transistor 613 is connected between the power node ND0 and the ninth node ND9, and a drain and a gate thereof are connected to each other. A first current Ia flowing in the PMOS transistor 613 may be calculated based on Equation 2.

$$Ia = \frac{\beta}{2} * (VDD - Va + Vth)^2 \quad \text{[Equation 2]}$$

Referring to Equation 2, β refers to a characteristic constant of the PMOS transistor 613 and Vth refers to a threshold voltage of the PMOS transistor 613.

The second resistor R2 and the NMOS transistor 614 connected in series are connected between the ninth node ND9 and the ground, and the NMOS transistor 614 is turned on/off in response to the enable signal EN. When the enable signal EN is ON, a current Itot flowing in the second resistor R2 may be calculated based on Equation 3.

$$Itot = Iload3 + Ia = \frac{Va}{R2} \quad \text{[Equation 3]}$$

Referring to Equation 3, the first input voltage generator 611 supplies a first input voltage Va proportional to the third load current Iload3 to the ninth node ND9. As a result, when temperature goes up, a first voltage Va increases, and when temperature goes down, the first voltage Va decreases.

The second input voltage generator 616 generates a second input voltage Vb in response to the first voltage Va and a read clock signal RCK. The second input voltage generator 616 includes PMOS transistors 617 and 618, an NMOS transistor 619, and a MOS capacitor 620.

The plurality of transistors 617, 618, and 619 are connected in series between the power node ND0 and the ground, and the PMOS transistor 617 is turned on/off in response to the first voltage Va. The MOS capacitor 620 is connected to a tenth node ND10. Each of the PMOS transistor 618 and the NMOS transistor 619 is turned on/off in response to the read clock signal RCK.

When the read clock signal RCK is at a high level, the PMOS transistor 618 is turned off and the NMOS transistor 619 is turned on, and thus charges of the MOS capacitor 620 are discharged. When the read clock signal RCK is at a low level, the PMOS transistor 618 is turned on and the NMOS transistor 619 is turned off, and thus the MOS capacitor 620 is charged. The second input voltage generator 616 may output a gate voltage of the MOS capacitor 620 as a second input voltage Vb.

The differential amplifier 615 amplifies a difference between the first input voltage Va and the second input voltage Vb and output an output voltage Vo through an eleventh node ND11 according to a result of the amplification. The differential amplifier 615 may include a sixth PMOS transistor P6, a diode-connected third NMOS transistor N3, a seventh PMOS transistor P7, and a fourth NMOS transistor N4.

The sixth PMOS transistor P6 is connected between the power node ND0 and a twelfth node ND12, and includes a gate for receiving the first input voltage Va. The seventh PMOS transistor P7 is connected between the power node ND0 and the eleventh node ND11, and includes a gate for receiving the second input voltage Vb. A gate of the diode-connected third NMOS transistor N3 and a gate of the fourth NMOS transistor N4 are commonly connected to each other.

The NOR gate 621 may perform an NOR operation on the output voltage Vo and the read clock signal RCK, and output a result of the operation as the pre-charge control signal Vpre, and provide the pre-charge control signal Vpre to the gate of the pre-charge current control circuit P2.

Figure 7:
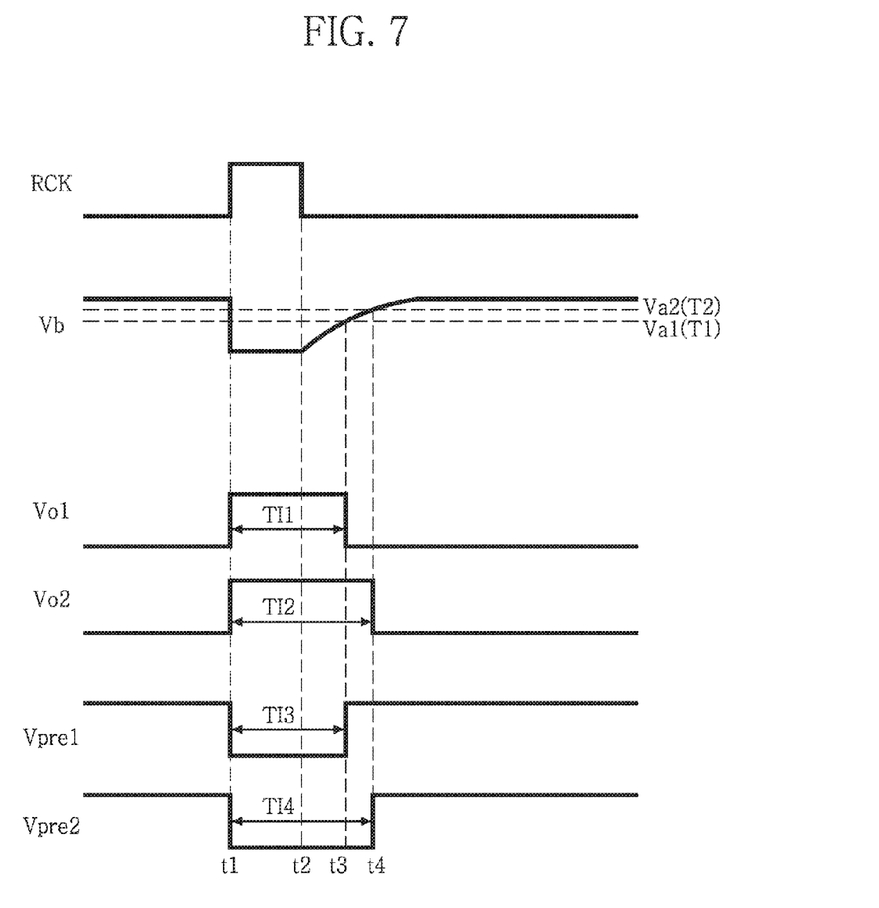
FIG. 7 is a timing diagram for describing an operation principle of the pulse width control circuit shown in FIG. 6.

FIG. 7 is a timing diagram for describing an operation principle of the pulse width control circuit shown in FIG. 6.

Referring to FIGS. 6 and 7, a first input voltage Va1, a first output voltage Vo1, and a first pre-charge control signal Vpre1 are defined when the temperature of the memory device 100A is a first temperature T1. Further, a first input voltage Va2, a second output voltage Vo2, and a second pre-charge control signal Vpre2 are defined when the temperature of the memory device 100A is a second temperature T2. The second temperature T2 is higher than the first temperature T1.

A first time interval TI1 refers to an interval between intersections t1 and t3 of the first input voltage Va1 associated with the temperature T1 and the second input voltage Vb, and a second time interval TI2 refers to an interval between intersections t1 and t4 of the first input voltage Va2 associated with temperature T2 and the second input voltage Vb.

When the read clock signal RCK rises to a high level from a low level at a first time t1, the MOS capacitor 620 is discharged. When the read clock signal RCK falls to the low level from the high level at a second time t2, the MOS capacitor 620 is charged.

At the first temperature T1, the differential amplifier 615 compares a level of the first input voltage Va1 associated with the first temperature T1 with a level of the second input voltage Vb and generates the first output voltage Vo1 having a pulse width corresponding to the first time interval TI1 according to a result of the comparison. The NOR gate 621 performs the NOR operation on the first output voltage Vo1 and the read clock signal RCK, and outputs a first pre-charge control signal Vpre1 having a pulse width corresponding to a third time interval TI3.

At the second temperature T2, the differential amplifier 615 compares a level of the first input voltage Va2 associated with the second temperature T2 with a level of the second input voltage Vb and generates a second output voltage Vo2 having a pulse width corresponding to the second time interval TI2 according to a result of the comparison. The NOR gate 621 performs the NOR operation on the second output voltage Vo2 and the read clock signal RCK, and outputs a second pre-charge control signal Vpre2 having a pulse width corresponding to a fourth time interval TI4.

The first time interval TI1 and the third time interval TI3 may be different from each other, and the second time interval TI2 and the fourth time interval TI4 may be different from each other.

Accordingly, when the temperature of the memory device 100A goes up, a level of the first input voltage Va increases and thus a pulse width of the pre-charge control signal Vpre increases, and when the temperature of the memory device 100A goes down, the level of the first input voltage Va decreases, and thus the pulse width of the pre-charge control signal Vpre decreases.

Figure 8:
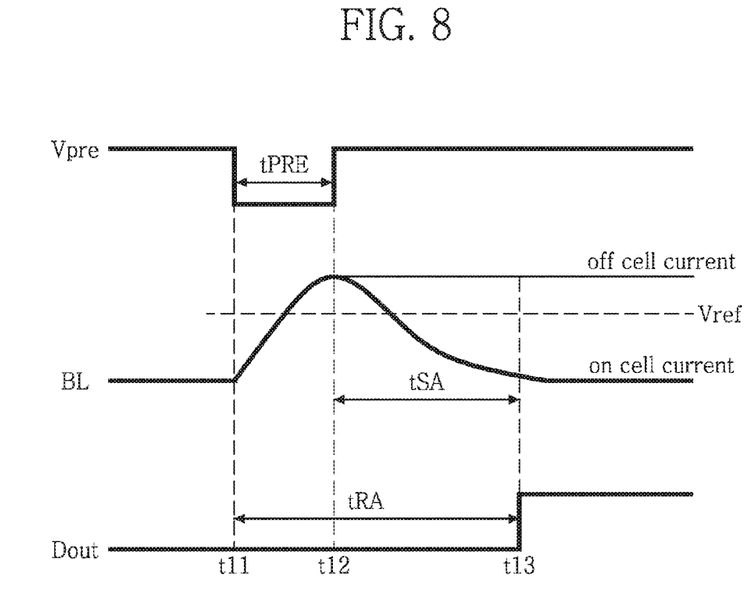
FIG. 8 is a timing diagram for describing a reading speed of the memory device according to example embodiments of the present inventive concepts.

FIG. 8 is a timing diagram for describing a reading speed of the memory device according to example embodiments of the present inventive concepts.

Referring to FIG. 8, a read time tRA refers to between a first time t11 and a third time t13, a pre-charge time tPRE refers to between the first time T11 and a second time t12, and a sensing time tSA refers to between the second time t12 and the third time t13.

The read time tRA of the memory device 100A may be defined as a sum of the pre-charge time tPRE and the sensing time tSA. The pre-charge time tPRE may refer to time required to pre-charge the bit line BL with a level of an operation voltage VDD based on the pre-charge control signal Vpre. The sensing time tSA may refer to time required to develop the bit line BL according to whether the memory cell 800 is an on-cell or off-cell.

A sensing current used to sense an on-cell or off-cell is expressed as shown in Equation 4.

$$I\_SA = (ION\_CELL) + (I\_BL) - (I\_LOAD) \quad \text{[Equation 4]}$$

Here, I_SA represents a sensing current, ION_CELL represents an on-cell current, I_BL represents a leakage current of the bit line, and I_LOAD represents a load current.

As the sensing current I_SA increases in volume, the sensing time tSA is reduced and a reading speed becomes faster, and as the sensing current I_SA decreases in volume, the sensing time tSA increases and the reading speed becomes slower.

The first load current I_LOAD=Iload1 decreases in volume, that is, an unnecessary first load current I_LOAD=Iload1 is not generated, when the temperature of the memory device 100A goes down, and thus the sensing current I_SA increases in volume and the reading speed becomes faster.

Figure 9A:
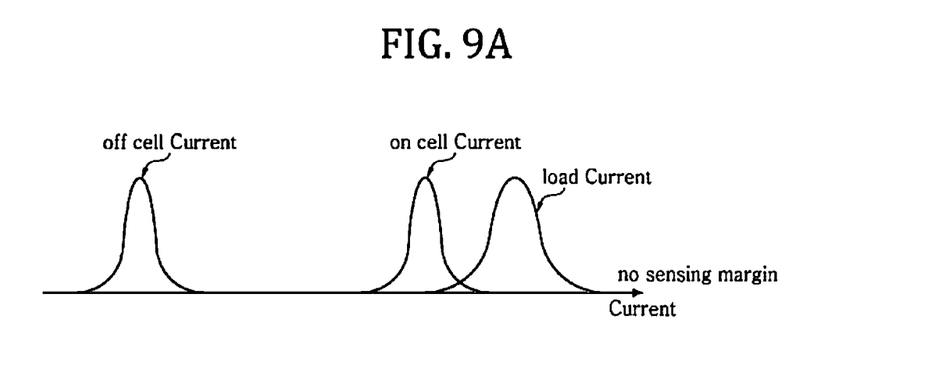
FIGS. 9A, 9B, and 9C is a graph for describing sensing margin improvement effects of the memory device according to example embodiments of the present inventive concepts.
Figure 9B:
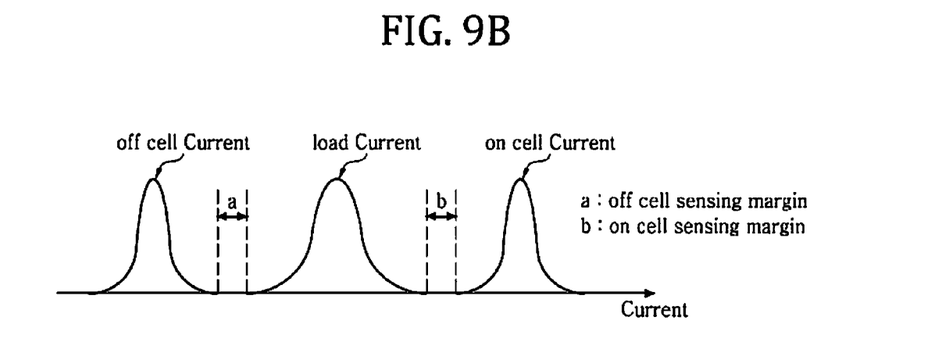
Figure 9C:
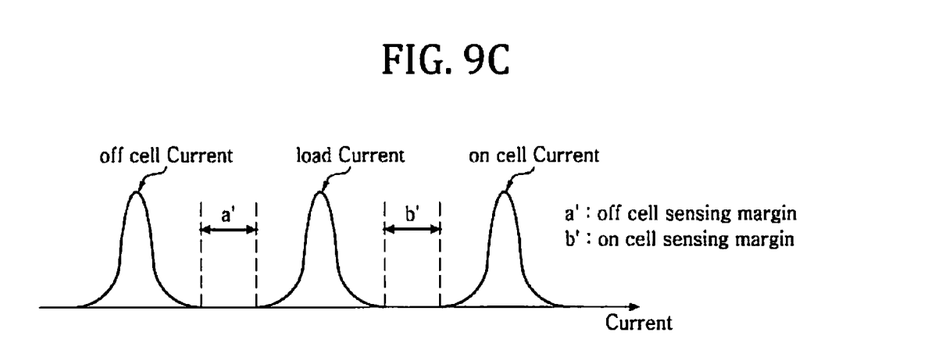

FIGS. 9A to 9C are graphs for describing sensing margin improvement effects of the memory device according to example embodiments of the present inventive concepts.

Referring to FIG. 9A, FIG. 9A represents a sensing margin when the memory device 100A does not include a control voltage generator 200, a current comparator 400, and a control code generator 500. When an amount of load currents becomes more than an amount of on-cell currents at a high operation voltage, there is no off-cell sensing margin and on-cell sensing margin. The off-cell sensing margin represents a current margin used for sensing a memory cell as an off-cell, and the on-cell sensing margin represents a current margin used for sensing a memory cell as an on-cell.

Referring to FIG. 9B, FIG. 9B represents a sensing margin when the memory device 100A includes the control voltage generator 200 only. The memory device including the control voltage generator 200 only may compensate for a leakage current of the bit line using a load current proportional to temperature but distribution of the load current is widened due to resistance and changes in process, and thus an off-cell sensing margin (a) and an on-cell sensing margin (b) appear narrow.

Referring to FIG. 9C, FIG. 9C represents a sensing margin when the memory device 100 includes all of the control voltage generator 200, the current comparator 400, and the control code generator 500. The memory device 100 may effectively compensate for the leakage current of the bit line by improving characteristics of the load current in accordance with the changes in process through trimming of the load current, and thus the off-cell sensing margin (a') and the on-cell sensing margin (b') appear wide.

Figure 10:
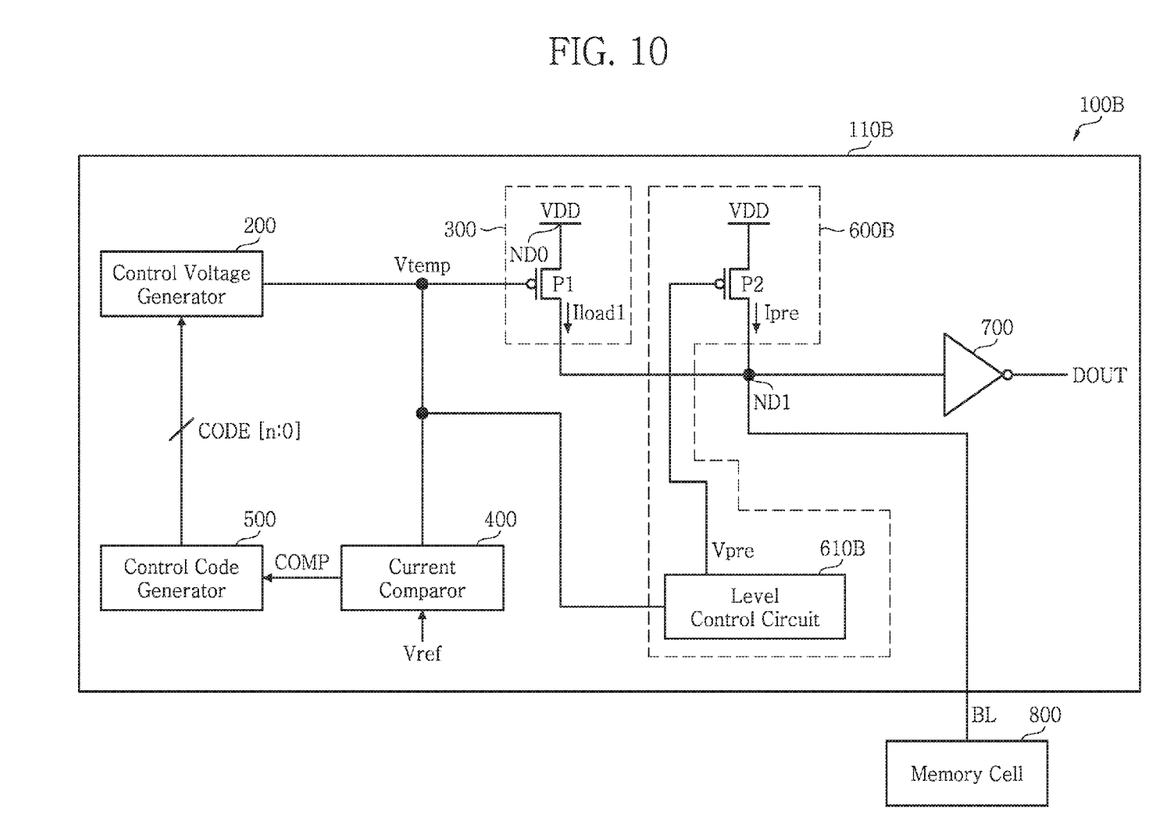
FIG. 10 is a block diagram of the memory device according to example embodiments of the present inventive concepts.

FIG. 10 is a block diagram of the memory device according to example embodiments of the present inventive concepts.

Referring to FIG. 10, except for a level control circuit 610B, a memory device 100B of FIG. 10 is substantially the same as or similar to the memory device 100A of FIG. 1 in structure and operation.

The level control circuit 610B may control a level of the pre-charge control signal Vpre based on the analog control voltage Vtemp. When a temperature of the memory device 100B goes up, the level of the pre-charge control signal Vpre decreases, and when the temperature of the memory device 100B goes down, the level of the pre-charge control signal Vpre increases.

The pre-charge current control circuit P2 may control the amount of pre-charge currents Ipre supplied to the bit line BL based on the level of the pre-charge control signal Vpre. The amount of pre-charge currents Ipre may increase when the temperature of the memory device 100B goes up.

A pre-charge circuit 600B may adjust the level of the pre-charge control signal Vpre to be inversely proportional to a temperature, and control the amount of the pre-charge currents Ipre supplied to the bit line BL based on the adjusted level, and thus the memory device 100B may adaptively compensate for a leakage current of the bit line depending on the temperature.

Figure 11:
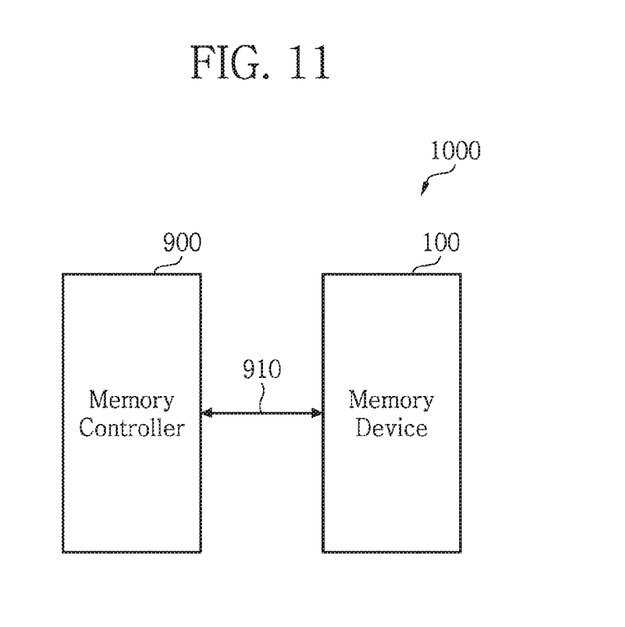
FIG. 11 is a block diagram of a memory system according to example embodiments of the present inventive concepts.

FIG. 11 is a block diagram of a memory system according to example embodiments of the present inventive concepts.

Referring to FIG. 11, a memory system 1000 may include a memory controller 900 and a memory device 100A or 100B (collectively, 100) connected to each other through an interface 910.

The memory system 1000 may be an embedded multimedia card (eMMC), a universal flash storage (UFS), a solid state drive (SSD), or a redundant array of independent disks (RAID) or redundant array of inexpensive disks (RAID); however, example embodiments are not limited thereto.

According to example embodiment, the memory device 100 may be a non-volatile memory-based data storage device such as a flash memory. For example, a non-volatile memory may include an electrically erasable programmable read-only memory (EEPROM), a magnetic RAM (MRAM), a ferroelectric RAM (FeRAM), a phase change RAM (PRAM), or a resistive RAM (RRAM).

The memory device 100 may be embodied in a volatile memory device according to exemplary embodiments. The volatile memory device may be a dynamic random access memory (DRAM) or a static RAM (SRAM); however, it is not limited thereto.

The memory device 100 may include a plurality of NAND flash memory devices. At least one of the plurality of NAND flash memory devices may include a three-dimensional memory cell array.

The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an example embodiment of the present inventive concept, the 3D memory array includes vertical NAND strings that are vertically oriented such that at least one memory cell is located over another memory cell. The at least one memory cell may comprise a charge trap layer.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

According to example embodiments, when the memory system 1000 is embodied in a mobile device, the memory system 1000 may further include a battery for providing an operation power to the memory device 100 and the memory controller 900.

The mobile device may be embodied in a portable computer, a digital camera, a personal digital assistance (PDA), a mobile phone, an MP3 player, a portable multimedia player (PMP), an automotive navigation system, a memory card, a system card, a game console, an electronic dictionary, an internet of things (IoT) device, an internet of everything (IoE) device, a wearable computer, or a drone.

The memory system 1000 may further include an interface, e.g., an input/output device, for transmitting or receiving data to or from an external data processing device.

The memory system 1000 may further include a wireless interface when the memory system 1000 is a wireless communication system. In this case, the wireless interface may be connected to the memory controller 900 and transmit or receive data to or from an external wireless device through an interface 910 by radio.

The wireless communication system may be a wireless device such as a PDA, a portable computer, a wireless phone, a pager, or a digital camera, an RFID reader, or an RFID system. The wireless system may be a wireless local area network (WLAN) system or a wireless personal area network (WPAN) system. In addition, the wireless system may be a cellular network.

Figure 12:
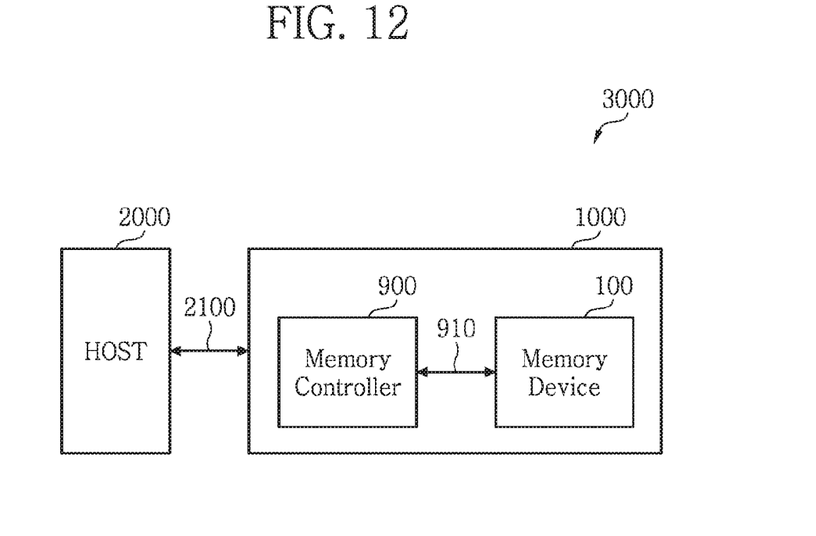
FIG. 12 is a block diagram of the memory system according to example embodiments of the present inventive concepts.

FIG. 12 is a block diagram of the memory system according to example embodiments of the present inventive concepts.

Referring to FIG. 12, a memory system 3000 may include a host 2000 and the memory system 1000. The host 2000 and the memory system 1000 may transmit or receive a command or data through an interface 2100. The memory system 3000 may be embodied in a personal computer (PC), a data server, or a mobile device.

The host 2000 may control an operation of the memory system 1000. The memory system 1000 may include the memory device 100 and the controller 900.

The memory controller 900 may transmit or receive a command or data to or from the host 2000 through the interface 910, and transmit or receive a command or data to or from the memory device 100. The memory controller 900 may control a general operation (for example, a write operation, a read operation, an erase operation, encoding/decoding, an error correction, and the like) of the memory device 100. The memory controller 900 may exchange data with the memory device 100 through a transmission medium (for example, transmission lines or a bus).

The memory device 100 according to example embodiments of the present inventive concepts can generate a load current proportional to an absolute temperature using a PTAT current, and adaptively compensate for a leakage current of a bit line depending on the absolute temperature using the generated load current.

The memory device 100 according to example embodiments of the present inventive concepts can adjust a pulse width of a pre-charge control signal to be proportional to the absolute temperature using the PTAT current, and adaptively compensate for a leakage current of the bit line depending on the absolute temperature by controlling an amount of pre-charge currents supplied to the bit line according to the adjusted pulse width.

The memory device 100 according to example embodiments of the present inventive concepts can adaptively compensate for the leakage current of the bit line depending on the absolute temperature, and thus can improve an off-cell sensing margin and an on-cell sensing margin.

The memory device 100 according to example embodiments of the present inventive concepts can adaptively compensate for the leakage current of the bit line depending on the absolute temperature, and thus can improve a reading speed of on-cells by increasing sensing currents.

The memory device 100 according to example embodiments of the present inventive concepts can increase the sensing currents by reducing an unnecessary load current and a pre-charge time, thereby increasing endurance of a memory cell. The memory device 100 according to example embodiments of the present inventive concepts can improve characteristics of load currents in accordance with changes in process through trimming of the load currents.

Although a few example embodiments of the inventive concepts have been shown and described, it will be appreciated by those skilled in the art that changes may be made in these example embodiments without departing from the principles and spirit of the inventive concepts, the scope of which is defined in the appended claims and their equivalents.

What is claimed is:

1. A memory device comprising:
a memory cell;
a bit line connected to the memory cell;
a control voltage generator configured to generate a proportional to absolute temperature (PTAT) current based on a control code, and to generate an analog control voltage inversely proportional to the PTAT current; and
a load current control circuit configured to control a first load current supplied to the bit line based on the analog control voltage.

2. The memory device of claim 1, further comprising:
a pre-charge current control circuit configured to control an amount of pre-charge current supplied to the bit line based on a pulse width of a pre-charge control signal; and
a pre-charge pulse width control circuit configured to control the pulse width of the pre-charge control signal based on the analog control voltage.

3. The memory device of claim 2, wherein, the pre-charge pulse width control circuit is configured to generate the pre-charge control signal such that the pulse width of the pre-charge control signal increases if a temperature of the memory device increases, and the pulse width of the pre-charge control signal decreases if the temperature of the memory device decreases.

4. The memory device of claim 2, wherein, when the temperature of the memory device increases, both the first load current and the pre-charge current increase.

5. The memory device of claim 2, further comprising:
a current generator configured to generate a second load current based on the analog control voltage, the second load current being same as the first load current; and
a control code generator configured to generate the control code based on the second load current and the reference current, and to provide the control code to the control voltage generator.

6. The memory device of claim 5, wherein,
the control code generator is configured to set the control code to a first value, if the second load current is less than the reference current, and
the control voltage generator is configured to increase an amount of the PTAT current, if the control code has the first value.

7. The memory device of claim 1, wherein the memory cell is one of a DRAM, a SRAM, and a NAND flash memory cell.

8. The memory device of claim 2, wherein a current driving capability of the pre-charge current control circuit is larger than a current driving capability of the load current control circuit.

9. A memory system comprising:
a memory controller; and
a memory device connected to the memory controller, the memory device including,
a memory cell,
a bit line connected to the memory cell,
a control voltage generator configured to generate a proportional to absolute temperature (PTAT) current based on a control code, and to generate an analog control voltage inversely proportional to the PTAT current, and
a load current control circuit configured to control a first load current supplied to the bit line based on the analog control voltage.

10. The memory system of claim 9, further comprising:
a pre-charge control circuit configured to control an amount of a pre-charge current supplied to the bit line based on a pulse width of a pre-charge control signal; and
a pre-charge pulse width control circuit configured to control activation time of the pre-charge control signal based on the analog control voltage.

11. The memory system of claim 10, wherein, the pre-charge pulse width control circuit is configured to generate the pre-charge control signal such that the activation time of the pre-charge control signal increases if a temperature of the memory device increases, and the activation time of the pre-charge control signal decreases if the temperature of the memory device decreases.

12. The memory system of claim 10, wherein, when the temperature of the memory device goes up, both the first load current and the pre-charge current increase in amount.

13. The memory system of claim 10, further comprising:
a current generator configured to generate a second load current based on the analog control voltage, the second load current being same as the first load current; and
a control code generator configured to generate the control code based on the second load current and the reference current, and to provide the control code to the control voltage generator.

14. The memory system of claim 13, wherein,
the control code generator is configured to set the control code to a first value, if the second load current is less than the reference current, and
the control voltage generator is configured to increase the amount of the PTAT current, if the control code has the first value.

15. The memory system of claim 10, wherein a current driving capability of the pre-charge current control circuit is larger than a current driving capability of the load current control circuit.

16. A memory device comprising:
a control voltage generator configured to generate an analog control voltage that is inversely proportional to a proportional to absolute temperature (PTAB) current; and
a load current control circuit configured generate a first load current based on the analog control voltage, the first load current being supplied to a memory cell via a bit line.

17. The memory device of claim 16, wherein the load current control circuit is configured to generate the first load current based on the analog control voltage such that the first load current is proportional to a temperature of the memory device and the memory device adaptively compensates for a leakage current associated with the bit line, the leakage current being based on the temperature of the memory device.

18. The memory device of claim 16, further comprising:
a pre-charge pulse width control circuit configured to control a pulse width of a pre-charge control signal based on the analog control voltage; and
a pre-charge current control circuit configured to control an amount of pre-charge current supplied to the bit line based on the pulse width of the pre-charge control signal.

19. The memory device of claim 16, further comprising:
a control code generator configured to generate a control code based on a second load current and a reference current, the second load current being based on the analog control voltage, wherein
the control voltage generator is configured to generate the PTAB current based on the control code.

20. The memory device of claim 19, wherein the load current control circuit is configured to generate the first load current by trimming the first load current to a same value as the reference current based on the PTAB current such that a size of sensing margins associated with the memory device increases.

* * * * *

UNITED STATES PATENT AND TRADEMARK OFFICE
CERTIFICATE OF CORRECTION

PATENT NO.       : 9,928,917 B2
APPLICATION NO.  : 15/440625
DATED            : March 27, 2018
INVENTOR(S)      : Hyun-Jin Shin et al.

It is certified that error appears in the above-identified patent and that said Letters Patent is hereby corrected as shown below:

In the Claims

In Claim 5, the recitation of "the second load current and the reference current" at Column 13, Lines 51-52, should be replaced with "the second load current and a reference current".

In Claim 10, the recitation of "a pre-charge control circuit configured to control an" at Column 14, Line 16, should be replaced with "a pre-charge current control circuit configured to control an".

In Claim 13, the recitation of "the second load current and the reference current" at Column 14, Line 40-41, should be replaced with "the second load current and a reference current".

Signed and Sealed this
Fifteenth Day of May, 2018

Andrei Iancu
*Director of the United States Patent and Trademark Office*